United States Patent
Sartschev et al.

(10) Patent No.: US 7,573,957 B2
(45) Date of Patent: Aug. 11, 2009

(54) STROBE TECHNIQUE FOR RECOVERING A CLOCK IN A DIGITAL SIGNAL

(75) Inventors: Ronald A. Sartschev, Andover, MA (US); Ernest P. Walker, Weston, MA (US)

(73) Assignee: Teradyne, Inc., North Reading, MA (US)

( * ) Notice: Subject to any disclaimer, the term of this patent is extended or adjusted under 35 U.S.C. 154(b) by 645 days.

(21) Appl. No.: 11/234,599

(22) Filed: Sep. 23, 2005

(65) Prior Publication Data

US 2007/0126487 A1 Jun. 7, 2007

(51) Int. Cl.
*H04L 27/06* (2006.01)

(52) U.S. Cl. ..................................... 375/342

(58) Field of Classification Search ............... 375/354, 375/337, 324, 316, 326, 327, 360, 224, 225; 327/165, 291, 26, 37
See application file for complete search history.

(56) References Cited

U.S. PATENT DOCUMENTS

| | | | |
|---|---|---|---|
| 3,363,183 A | 1/1968 | Bowling et al. | 328/63 |
| 3,471,790 A | 10/1969 | Kaps | 328/63 |
| 3,612,906 A | 10/1971 | Kennedy | 307/269 |
| 3,947,697 A | 3/1976 | Archer et al. | 307/208 |
| 3,997,740 A | 12/1976 | Eubank et al. | |
| 4,119,910 A | 10/1978 | Hayashi | 324/83 R |
| 4,488,108 A | 12/1984 | Treise et al. | 324/83 D |
| 4,686,458 A | 8/1987 | Beyerbach et al. | 324/83 D |
| 4,989,202 A | 1/1991 | Soto et al. | |
| 5,003,194 A | 3/1991 | Engelhard | 307/265 |
| 5,084,669 A | 1/1992 | Dent | 324/83 D |
| 5,258,968 A | 11/1993 | Matsuda et al. | 369/44.35 |
| 5,293,079 A | 3/1994 | Knoch | 307/234 |
| 5,321,700 A | 6/1994 | Brown et al. | 371/27 |
| 5,381,100 A | 1/1995 | Hayashi | 324/601 |

(Continued)

FOREIGN PATENT DOCUMENTS

WO   WO/2007/038233   4/2007

OTHER PUBLICATIONS

International Search Report and Written Opinion Application No. PCT/US06/37100 mailed on Sep. 25, 2007, 10 pages.

(Continued)

*Primary Examiner*—Sam K Ahn
(74) *Attorney, Agent, or Firm*—Foley & Lardner LLP; Joseph M. Maraia; Ralph Trementozzi (57) ABSTRACT

A method and apparatus is provided to recover clock information embedded in a digital signal such as a data signal. A set of strobe pulses can be generated by routing an edge generator to a delay elements with incrementally increasing delay values. A set of latches triggered by incrementally delayed signals from the edge generator can capture samples of the data signal. An encoder can convert the samples to a word representing edge time and polarity of the sampled signal. The word representing edge time can be stored in memory. An accumulator can collect the average edge time over N samples. The average edge time can be adjusted with a fixed de-skew value to form the extracted clock information. The extracted clock information can be used as a pointer to the words stored in memory.

20 Claims, 6 Drawing Sheets

U.S. PATENT DOCUMENTS

| | | | |
|---|---|---|---|
| 5,483,534 A | 1/1996 | Ohki et al. | |
| 5,499,190 A | 3/1996 | Takahashi et al. | |
| 5,568,071 A | 10/1996 | Hoshino et al. | 377/43 |
| 5,818,849 A | 10/1998 | Komatsu | |
| 6,173,207 B1 | 1/2001 | Eidson | |
| 6,198,700 B1 | 3/2001 | Sassoon | |
| 6,204,710 B1 | 3/2001 | Goetting et al. | |
| 6,233,528 B1 | 5/2001 | Lai et al. | 702/69 |
| 6,285,722 B1 | 9/2001 | Banwell et al. | |
| 6,291,981 B1 | 9/2001 | Sartschev | 324/76.82 |
| 6,377,065 B1 | 4/2002 | Le et al. | |
| 6,437,589 B1 | 8/2002 | Sugano | 324/763 |
| 6,556,640 B1* | 4/2003 | Baba | 375/376 |
| 6,606,360 B1* | 8/2003 | Dunning et al. | 375/354 |
| 6,643,810 B2 | 11/2003 | Whetsel | |
| 6,715,111 B2 | 3/2004 | Self et al. | |
| 6,735,543 B2 | 5/2004 | Douskey et al. | 702/120 |
| 6,771,061 B2 | 8/2004 | Sartschev et al. | |
| 6,868,047 B2 | 3/2005 | Sartschev et al. | |
| 7,054,374 B1* | 5/2006 | Jensen et al. | 375/257 |
| 7,266,738 B2 | 9/2007 | Sato | |
| 2003/0046622 A1 | 3/2003 | Whetsel | |
| 2004/0260492 A1* | 12/2004 | Halle et al. | 702/69 |
| 2005/0157780 A1 | 7/2005 | Werner et al. | |
| 2005/0157781 A1 | 7/2005 | Ho et al. | |
| 2007/0071080 A1 | 3/2007 | Sartschev et al. | |
| 2007/0091991 A1 | 4/2007 | Sartschev et al. | |
| 2007/0126487 A1 | 6/2007 | Sartschev et al. | |

OTHER PUBLICATIONS

International Search Report and Written Opinion of Application No. PCT/US06/37099 mailed on Sep. 18, 2007, 6 pages.

International Search Report and Written Opinion for Application No. PCT/US2006/036912 mailed on Oct. 30, 2008, 11 pages.

Eby G. Friedman, "Clock Distribution Networks in Synchronous Digitial Integrated Circuits", Proceedings of the IEEE, vol. 89, No. 5, May 2001, pp. 665-692.

Grochowski et al., "Integrated Circuit Testing for Quality Assurance in Manufacturing: History, Curren Status, and Future Trends", IEEE Transactions on Circuits and Systems-II: Analog and Digital Signal Processing, vol. 44, No. 8, Aug. 1997, pp. 610-633.

Chang et al., "A Wide-Range Delay-Locked Loop With a Fixed Latency of One Clock Cycle", IEEE Journal of Solid-State Circuits, vol. 37, No. 8, Aug. 2002, pp. 1021-1027.

Dr. Paul D. Franxon, ECE 733 Class Notes, www.ece.ncsu.edu/erl/faculty/paulf.html, numbered 12-47. 2003.

Notice of Allowance for U.S. Appl. No. 11/234,814 dated Feb. 24, 2009.

Office Action for U.S. Appl. No. 11/234,814 dated Nov. 12, 2008.

Office Action for U.S. Appl. No. 11/234,814 dated Jul. 24, 2008.

Office Action for U.S. Appl. No. 11/234,542 dated Jan. 21, 2009.

Office Action U.S. Appl. No. 11/234,542 dated Jan. 9, 2008.

* cited by examiner

STROBE TECHNIQUE FOR RECOVERING A CLOCK IN A DIGITAL SIGNAL

FIELD OF THE INVENTION

The present invention relates generally to testing of semiconductor chips and more specifically to clocking of digital devices.

BACKGROUND OF THE INVENTION

Automatic test equipment (ATE) is universally used to test semi-conductor chips and integrated circuits during their manufacture. Functional testing is typically performed by configuring the ATE to apply electrical signals to numerous connection points on the device under test (DUT) while measuring the output response of the DUT at certain connection points.

ATE typically determines the relative timing between applied input signals and measured output signals when evaluating the performance of a DUT. Very accurate timing of the test system clock is often required to ensure that appropriate data is collected, particularly when evaluating a DUT's response to high speed signals.

It is often desirable to test the performance of a DUT relative to its own system clock. Accordingly, ATE can typically be configured to measure output at times relative to the DUT's internal clock. However, measurements relative to the DUT's system clock can be inaccurate at high data rates and clock speeds because signal slewing and jitter significantly affect measurement results.

Many integrated circuits (ICs) now include buses with a synchronous clock that accompanies the data. It is impractical to access a DUT's synchronous internal clock without tying up valuable test system hardware channels. It has also heretofore been problematic to use a test system clock to test data on buses having a synchronous clock because data on the bus may have very high jitter relative to the test system clock.

A method and apparatus which uses a test system clock to emulate the DUT clock for comparison with DUT data signals without suffering the excessive slew and jitter usually associated with use of the system clock is described in Applicant's co-pending U.S. patent application Ser. No. 11/234,542 entitled "Strobe Technique for Test of Digital Signal Timing" filed Sep. 23, 2005, which is incorporated herein by reference.

In systems having clock information imbedded in a digital signal, it is often desirable to recover the clock information for testing purposes. In the field of ATE, for example, it is often desirable to recover clock information that is imbedded in a digital signal that is received from a DUT. Clock information has heretofore typically been recovered from digital signals by using phase-locked loop PLL based clock recovery circuits. PLL based clock recovery circuits are disadvantageously limited to use in specific pre-set bandwidths.

SUMMARY OF THE INVENTION

Embodiments of the present invention recover clock information embedded in a digital signal such as a data signal. In an illustrative embodiment, a set of strobe pulses is generated by routing an edge generator to a series of delays with incrementally increasing delay values. A digital signal is applied to the input of each of a set of parallel latches which are clocked by the strobe pulses. The set of parallel latches thereby captures a single shot series of samples of the data signal at incrementally increasing delayed times.

In the illustrative embodiment, an encoder converts the single shot series of samples to a word representing edge time and polarity of the sampled signal. The word representing edge time can be stored in memory. An accumulator collects the average edge time over a number (N) of samples. The value N used in the accumulator, which sets the number of samples over which to average data, thereby sets the effective bandwidth of the illustrative embodiments of the present invention. The average edge time is adjusted with a fixed de-skew value, which can be stored in a register, for example. The resulting adjusted time represents a recovered clock time which is then used as a pointer to memory. The difference between the recovered clock time and data edge time stored at the address pointed to by the recovered clock can be determined and compared against expected values.

In an illustrative embodiment, the present invention provides a method for extracting a clock signal from a digital signal by applying a strobe to the digital signal, storing the state of the digital signal at the time of each strobe pulse of the strobe, encoding the stored states as a digital word which identifies an edge time of a state change in the digital signal and determining an average edge time over a predetermined number of samples of the digital word. The digital signal can be a data signal of a device under test, for example. In a particular embodiment, the digital word can be stored in a memory location and the average edge time can be used as a pointer to the memory location.

In particular embodiments, a fixed de-skew value can be added to the average edge time to form an adjusted average edge time. The adjusted average edge time represents the extracted clock which can be used as a pointer to memory. The average edge time or adjusted average edge time can be distributed to a plurality of channels over a bus and used as a pointer to memory on a recipient channel of the plurality of channels. Data edge times stored in memory that are addressed by the average edge time or the adjusted average edge time can be compared with expected data to provide a pass or fail indication for a device under test.

The strobe can be applied to the digital signal by applying each edge of the strobe as a latch-clock signal to a corresponding latch of a plurality of latches, applying the digital signal to the input of each of the latches and receiving the state of the digital signal as output of each of the latches. In particular embodiments, the encoding step results in a multi-bit word of which a first portion identifies the time of the state change and a second portion identifies the polarity of the state change. Transmission of the multi-bit word can be de-multiplexed to reduce a transmission rate thereof.

In illustrative embodiments of the invention, the strobe can be generated by applying an edge generator output signal to delay circuitry including a series of delay elements and providing a connection between each of the delay elements to receive a plurality of sequentially delayed copies of the pulses of the edge generator output signal. Each of the delayed copies forms one of the strobe pulses. The delay circuitry can be controlled by a delay locked loop wherein the delay elements include controllable summing elements which are tunable to correct delay line errors.

Another illustrative embodiment of the present invention provides an apparatus for extracting a clock signal from a digital signal. The illustrative apparatus includes a plurality of increasing strobe delay elements in communication with an edge generator, a plurality of latches, each having a clocking input connected to a corresponding one of the delay elements and having a data input receiving the data signal and an encoder in communication with the plurality of latches. The encoder is adapted to transform information stored in the plurality of latches into a digital word representing edge time of the digital signal. The illustrative embodiment also includes averaging circuitry adapted to receive a plurality of the digital words from the encoder and determine the average thereof. A memory in communication with the encoder can be provided for receiving and storing the digital words. De-multiplexing circuitry can be provided in communication with the encoder and the memory for reducing the rate of data transfer into the memory.

In a particular embodiment, the averaging circuitry can include an accumulator in communication with the encoder and receiving the digital words. A clock delay data register stores a de-skew value. Adding circuitry in communication with the accumulator and the clock delay register is adapted for adding the average edge time to the de-skew value to provide an adjusted average edge time which represents an extracted clock value.

Routing circuitry in communication with the averaging circuitry and the memory can be provided for addressing the memory using the extracted clock value as a pointer to the memory. The routing circuitry can be adapted for communication with a plurality of channels and can include a clock bus, for example. Comparison circuitry in communication with the memory can be provided for comparing expected values of the data at specific clock times with values of the data in the memory addressed by the extracted clock value.

BRIEF DESCRIPTION OF THE DRAWINGS

The foregoing and other features and advantages of the present invention will be more fully understood from the following detailed description of illustrative embodiments taken in conjunction with the accompanying drawings in which.

DETAILED DESCRIPTION

Figure 1:
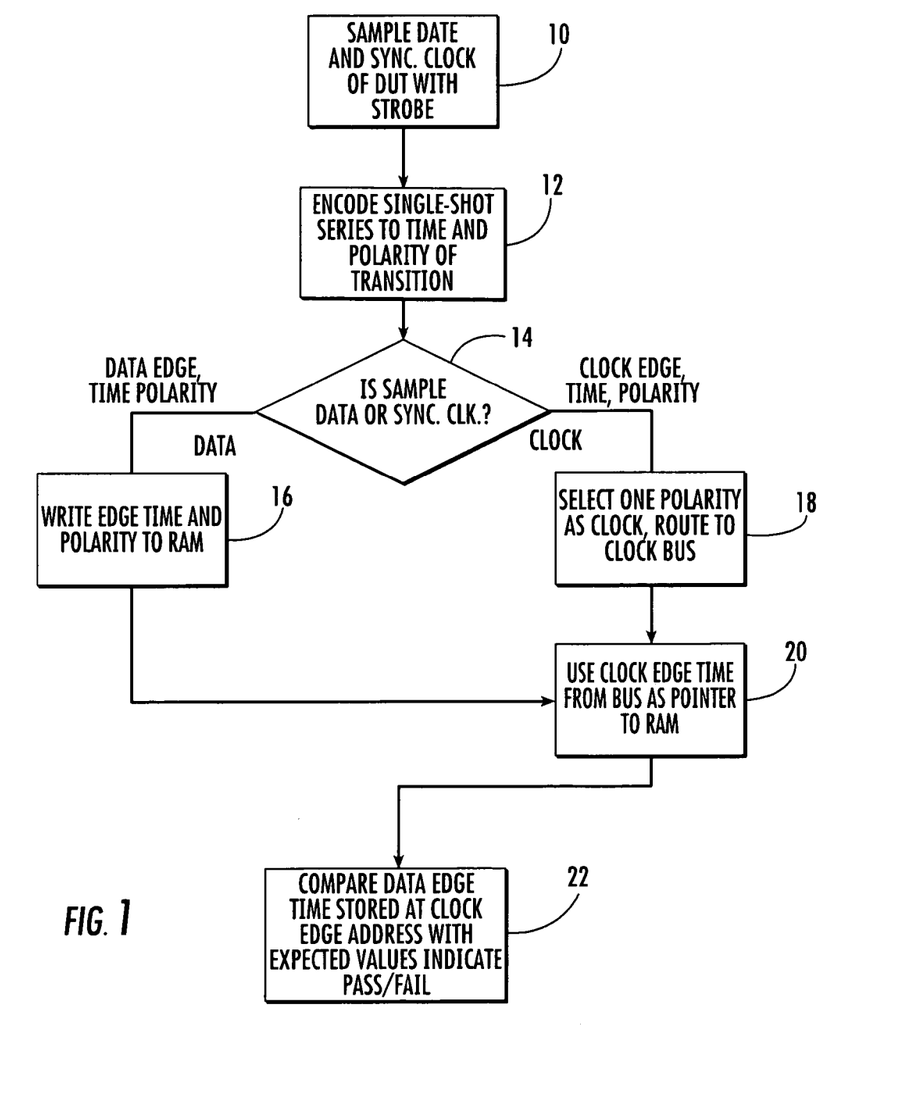
FIG. 1 is a functional block diagram of a method for testing data signals or clock signals of a device under test using particular elements of illustrative embodiments of the present invention.

An illustrative method for testing and evaluating synchronously clocked data without directly comparing the synchronous clock signals to the data signals under test is described generally with reference to FIG. 1.

In a sampling step 10, data signals and clock signals of a device under test (DUT) are sampled to acquire binary values of their state at a high rate using a strobe. The sampled data is thus acquired as a single-shot series of samples of the signal under test at incrementally delayed intervals. It should be understood that, although the term "single-shot" is used herein, multiple iterations of the sampling step 10 can be performed, for example on multiple channels or over time in multiple iterations of the inventive clock recovery method, such that a plurality of "single-shot" series can be acquired in various embodiments of the present invention.

Within the single shot series, an edge time and edge polarity of the signal under test is detected. In an encoding step 12, the detected edge time and polarity is encoded in a binary word. In an illustrative example, the encoded edge time is represented as the five least significant bits of a 6-bit word and the polarity is represented as the most significant bit.

In an example of high speed test equipment using the present method, the encoded 6-bit words are generated at about 2 gigabytes per second. To provide a data rate more suitable for the storage and comparison steps downstream, the encoded words are de-multiplexed to provide 48-bit words at only 250 megabytes per second. The 48-bit words represent eight 5-bit edge times and the corresponding eight 1-bit edge polarities.

In a selector step 14, it is determined whether the encoded data represents the edge time and polarity of a sampled data signal or the edge time and polarity of sampled clock signal. If the encoded data represents the edge time and polarity of a sampled data signal, a storage step 16 is performed in which the encoded data is stored in random access memory. In the illustrative method a 96 by 40 random access memory is used to store the encoded data.

If the encoded data represents the edge time and polarity of a sampled synchronous clock signal, then only encoded data having one polarity is selected and used as a clock edge time. In a clock selection step 18, the encoded clock edge time is routed to a clock bus. Thus, the clock edge data can be routed to a plurality of channels and used in one or more chips.

In a memory accessing step 20, the clock data is used as a pointer to the random access memory address of corresponding encoded data signal edge time. In a comparison step 22, the data edge time found in memory at the clock address is compared to an expected value to determine whether the represented data signal edge time is within pre-specified limits of the represented clock edge time. A pass/fail indication can thereby be automatically generated.

Figure 2:
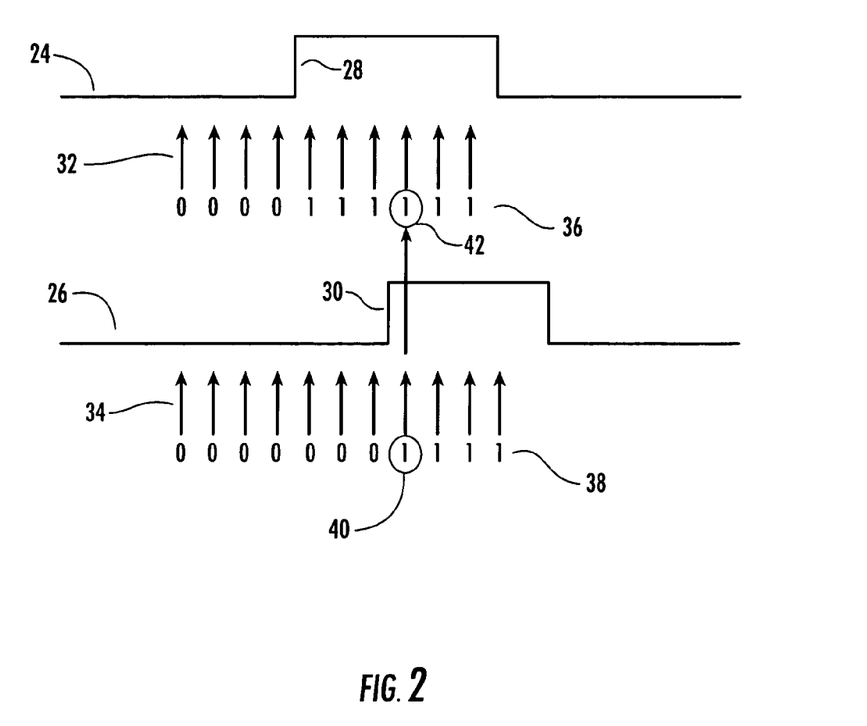
FIG. 2 is a schematic timing diagram showing the application of a strobe to digital signals according to illustrative embodiments of illustrative embodiments of the present invention.

The sampling step 10 is performed to acquire closely spaced readings of the state of a data signal and/or clock signal of the DUT. FIG. 2 is a schematic timing diagram showing an example of the relative timing of a data signal 24 edge and a clock signal 26 of a device under test. The data signal 24 in a device under test is shown as a voltage/logic level that changes state at edge 28. The clock signal 26 changes state at edge 30. The strobes 32, 34 provide pulses which each trigger a sampling of the state of the data signal under test.

The sampling thereby results in a series of bits 36, 38 indicating the state of the data or clock signal under test at closely spaced time intervals. A change of state 40 in the series of bits 38 representing the clock signal can be used as a timing reference for comparison against the state 42 of the data signal in the series of bits 36 representing the data signal. In the illustrative method, the series of bits 36 and 38 are further encoded before a comparison is made therebetween as described herein with reference to FIG. 1 and FIG. 4.

It should be understood by persons skilled in the art that the term "closely spaced" as used throughout the present specification to describe a series of strobe pulses or signals should be broadly interpreted and that such spacing may vary according to the needs of a particular test application. It should be understood that such pulses or signals that are "closely spaced" relative to the timing of a device under test would likely have a higher frequency than the signal under test or clock signal, or may have the same frequency.

Figure 3:
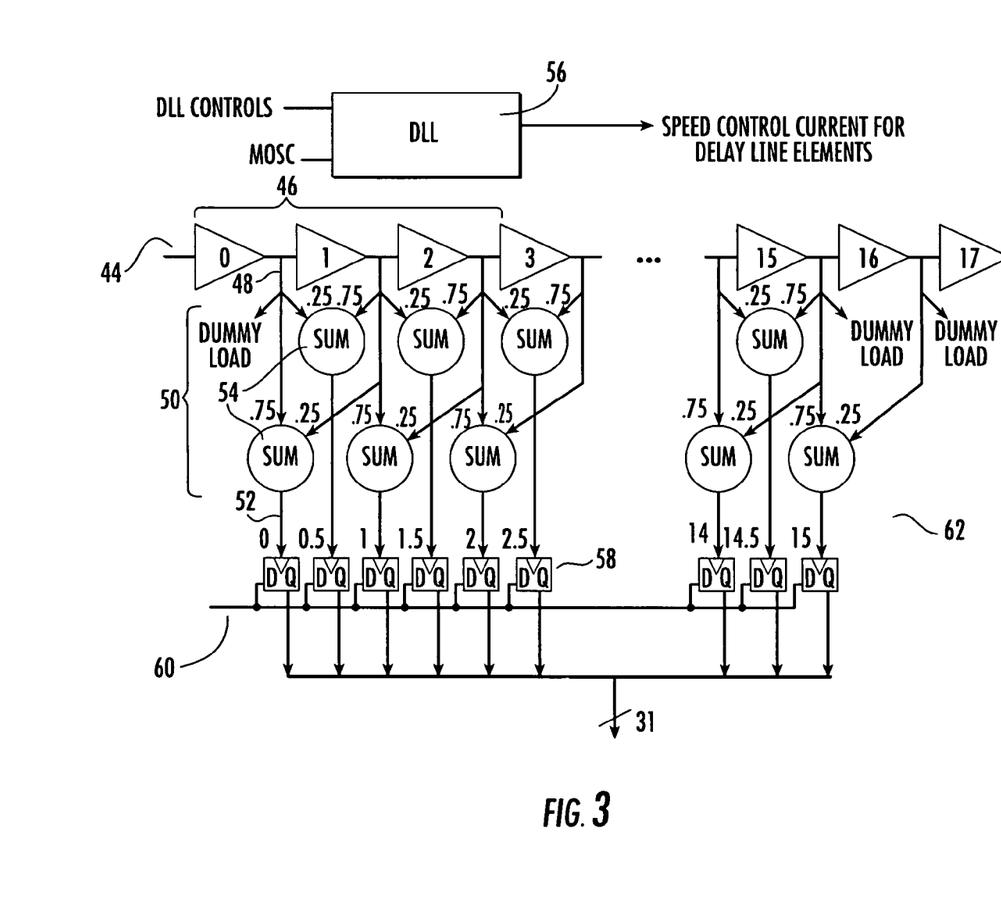
FIG. 3 is a schematic diagram of multi-strobe sampler used in the several illustrative embodiments of the present invention.

A sampling apparatus for acquiring strobed samples of a data or clock signal under test is shown in FIG. 3. An initiator signal such as a single strobe pulse is generated by a conventional edge generator, and applied to a delay line input 44. A series of delay elements output incrementally delayed copies 48 of the initiator signal. In the illustrative apparatus, the incrementally delayed copies 48 of the initiator signal are directed through summing circuitry 50 as known in the art to interpolate between the delay elements and thereby provide additional more closely spaced copies 52 of the initiator signal.

In the illustrative apparatus, the summing circuitry 50 includes summing elements 52 which each comprise a Gilbert cell based on a fine vernier with 8 settings (i.e., 3-bit control). The settings can be tuned to correct delay line errors. Speed control currents for the delay line elements 46 are provided by a delay locked loop 56. Each of the closely spaced delayed copies of the input strobe pulse are provided to the clock input of a corresponding D-latch 58. The data signal or synchronous clock signal under test 60 is routed to the input to each of the D-latches. As a result, the data stored in the D-latches represents a binary snap shot of the states of the data signal, or clock signal under test. In the illustrative apparatus, a set of 31 D-latches is used to capture a 31-bit wide strobed representation of the signal under test.

An apparatus for using a strobed representation of the synchronous clock to test data signals in a DUT is described with reference to FIG. 4. A signal under test 59 and a strobe 61 are applied to a sampling circuit 62. In the illustrative apparatus, the sampling circuit 62 is the sampling apparatus described in detail with respect to FIG. 3. An encoder circuit 64 in communication with the sampling circuit 62 accepts the closely spaced strobed representation of the signal under test from the sampling circuit 62 and converts it to a data word representing an edge time and an edge polarity, (i.e., high to low or low to high). In the illustrative apparatus, the encoder converts a 31-bit binary snap shot of the edge transition to a 6-bit word. The most significant bit is used to represent the edge polarity and the remaining 5-bits are used to represent the edge time. Although the encoding described herein uses 6-bit words, and 1-bit polarity representation for the purposes of illustration, persons having ordinary skill in the art should appreciate that numerous other word lengths can be used and data can be encoded therein under other schemes.

In the illustrative apparatus, the 6-bit words are output from the encoder at about 2 gigabytes per second. A de-multiplexer 66 in communication with the encoder 64 is used to convert the data into 48-bit words at a data rate of 250 megabytes per second. The 48-bit words include eight 5-bit data words representing edge times and their corresponding 8 single polarity bits. Persons having ordinary skill in the art should appreciate that de-multiplexing may not be necessary in all cases and that various other bit rates and/or de-multiplexing details can be chosen.

Router circuitry 70 is used to route signals that represent the synchronous clock of the DUT onto a tester clock bus 72. The routing circuitry 70 also selects only clock edge times with one polarity to represent a system clock, i.e., selects edge times representing a clock set (up polarity) and disregards of the clock reset (down polarity). The clock edge times thereby routed to a tester bus 72 can be used on a plurality of channels.

The words output from the de-multiplexer 66 that represent data signals of a DUT are not selected as clock signals and are stored directly in random access memory 68. In the illustrative apparatus, the data is stored in 96×40 random access memory. Persons having ordinary skill in the art should appreciate that numerous other random access memory configuration can be used.

The clock edge times on the tester bus 72 are used as pointers to address the data stored in random access memory 68. Routing circuitry 74 selects which clock on the bus to use as a pointer and routes that clock edge time to comparison circuit 76. Comparison circuit 76 provides the clock edge time as an address to random access memory 68 and reads the data edge time stored at that address. The data read from random access memory is compared with the clock edge time to determine the difference therebetween.

Comparison circuitry 78 compares expected values 77 of the difference between a data edge and synchronous clock edge with the difference found by comparison circuit 76. The comparison circuitry 78 outputs pass or fail signals for each comparison according to whether the difference from expectations is within specified limits.

Accordingly, the various embodiments of the multi-strobe testing method and apparatus described herein may provide a means for representing a signal under test in terms of its precise edge times and polarity of transition at the corresponding edge times. The edge times and polarities thus represented are stored for comparison with a timing signal such as the synchronous clock of a device under test. The timing signal is also represented in terms of its precise edge times. This representation of the timing signal edge time can be provided to a clock bus for use throughout a test system, for example, to compare with a corresponding data signal edge time in random access memory. The result of such a comparison can be checked against an expected value to determine whether a device under test is in compliance with test specifications.

An illustrative method of recovering clock information from a data signal can be achieved by adding steps to the method for testing and evaluating synchronously clocked data that was described hereinbefore with reference to FIG. 1. The illustrative method for recovering clock information from a data signal is described generally with reference to FIG. 5.

Figure 5:
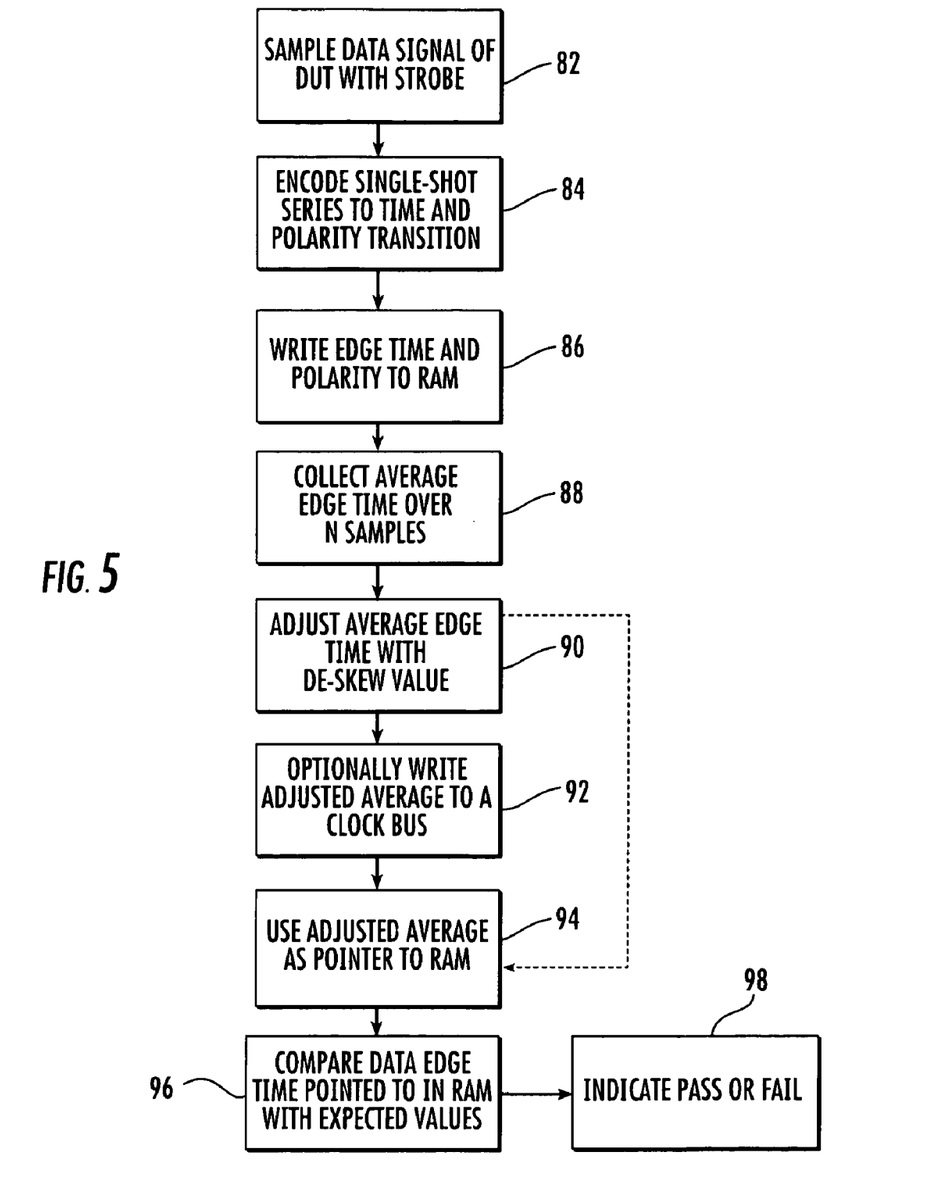
FIG. 5 is a functional block diagram of a method for recovering clock information from a digital signal according to illustrative embodiments of the present invention.

A sampling step 82 is performed in which an edge generator initiates an input strobe. Digital signals such as data signals of a device under test (DUT) are sampled to acquire binary values of their state at a high rate using the strobe. The acquired binary values provide a single-shot series of samples of the digital signal at incrementally delayed intervals.

Within the single shot series, an edge time and edge polarity are detected. In an encoding step 84, the detected edge time and polarity is encoded as a binary word. In an illustrative example, the encoded edge time is represented as the five least significant bits of a 6-bit word and the polarity is represented as the most significant bit.

In an example of high speed test equipment using the illustrative method of the present invention, the encoded 6-bit words are generated at about 2 gigabytes per second. To provide a data rate more suitable for the storage and comparison steps downstream, the encoded words may be de-multiplexed to provide 48-bit words at only 250 megabytes per second. The 48-bit words represent eight 5-bit edge times and the corresponding eight 1-bit edge polarities.

A storage step 86 is performed in which the encoded edge time is stored in memory. In the illustrative method, a 96 by 40 random access memory is used to store the encoded edge time.

An average accumulator step 88 is performed in which encoded edge times are accumulated over a number (N) of samples and an average edge time over N samples is determined. An average adjustment step 90 can then be performed in which the average edge time is adjusted by a de-skew value. In an illustrative embodiment, the de-skew value is a fixed value. In an optional write-to-bus step 92, the adjusted average can be written to a clock bus. The adjusted average represents an extracted clock.

In a memory accessing step 94, the adjusted average is used as a pointer to the memory address of corresponding encoded data signal edge time. In a comparison step 96, the data edge time found in memory at the address pointed to by the extracted clock is compared to an expected value to determine whether the represented data signal edge time is within prespecified limits of the extracted clock time. In a final step 98, a pass/fail indication can thereby be automatically generated.

Figure 4:
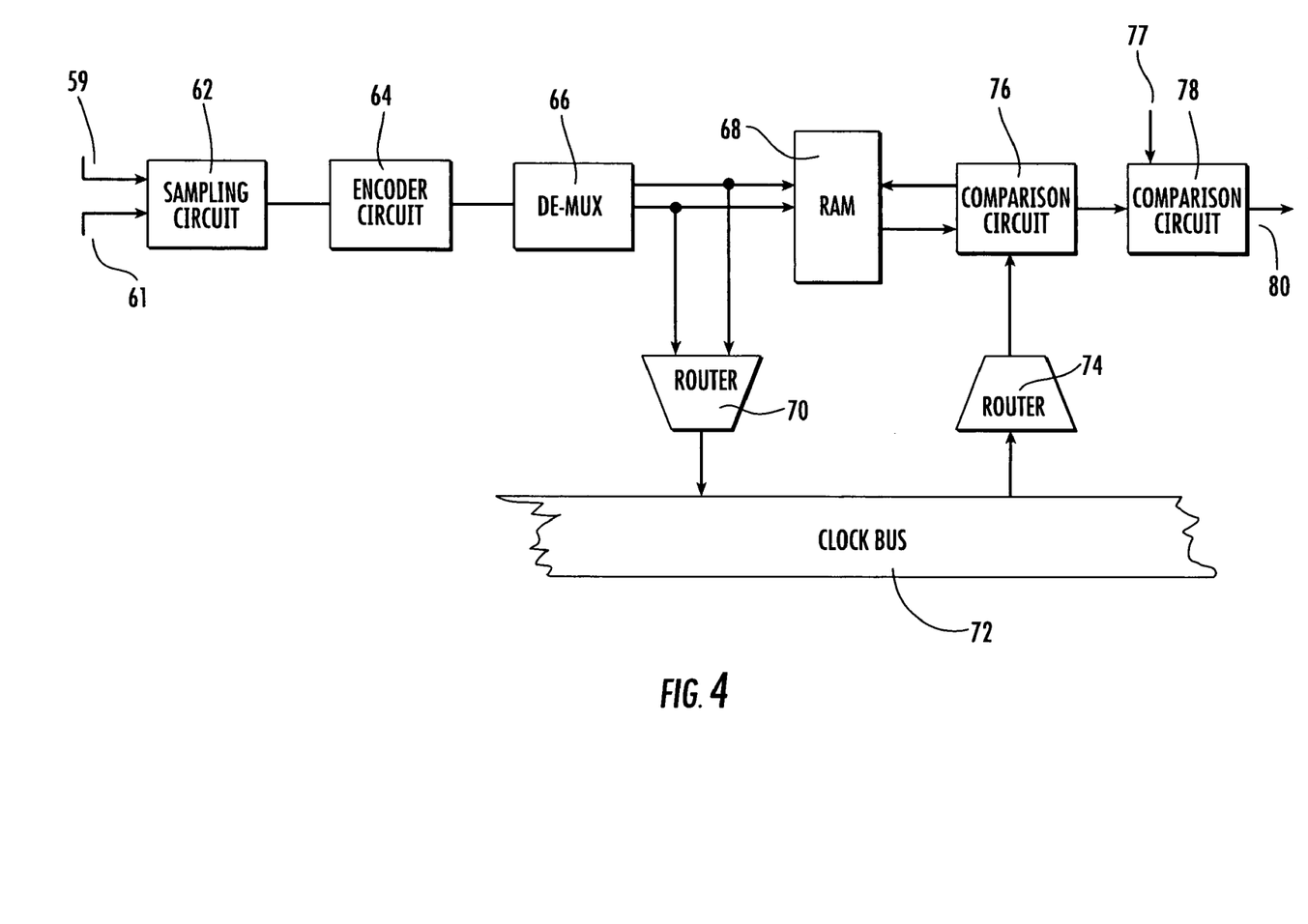
FIG. 4 is a schematic diagram of an apparatus for testing data signals or clock signals of a device under test using particular elements of illustrative embodiments of the present invention.

An illustrative apparatus for extracting clock information from a digital signal is described by adding elements to the apparatus for using a strobed representation of the synchronous clock to test data signals in a DUT that was described hereinbefore with reference to FIG. 4. The illustrative apparatus for extracting clock information is described generally with reference to FIG. 6.

Figure 6:
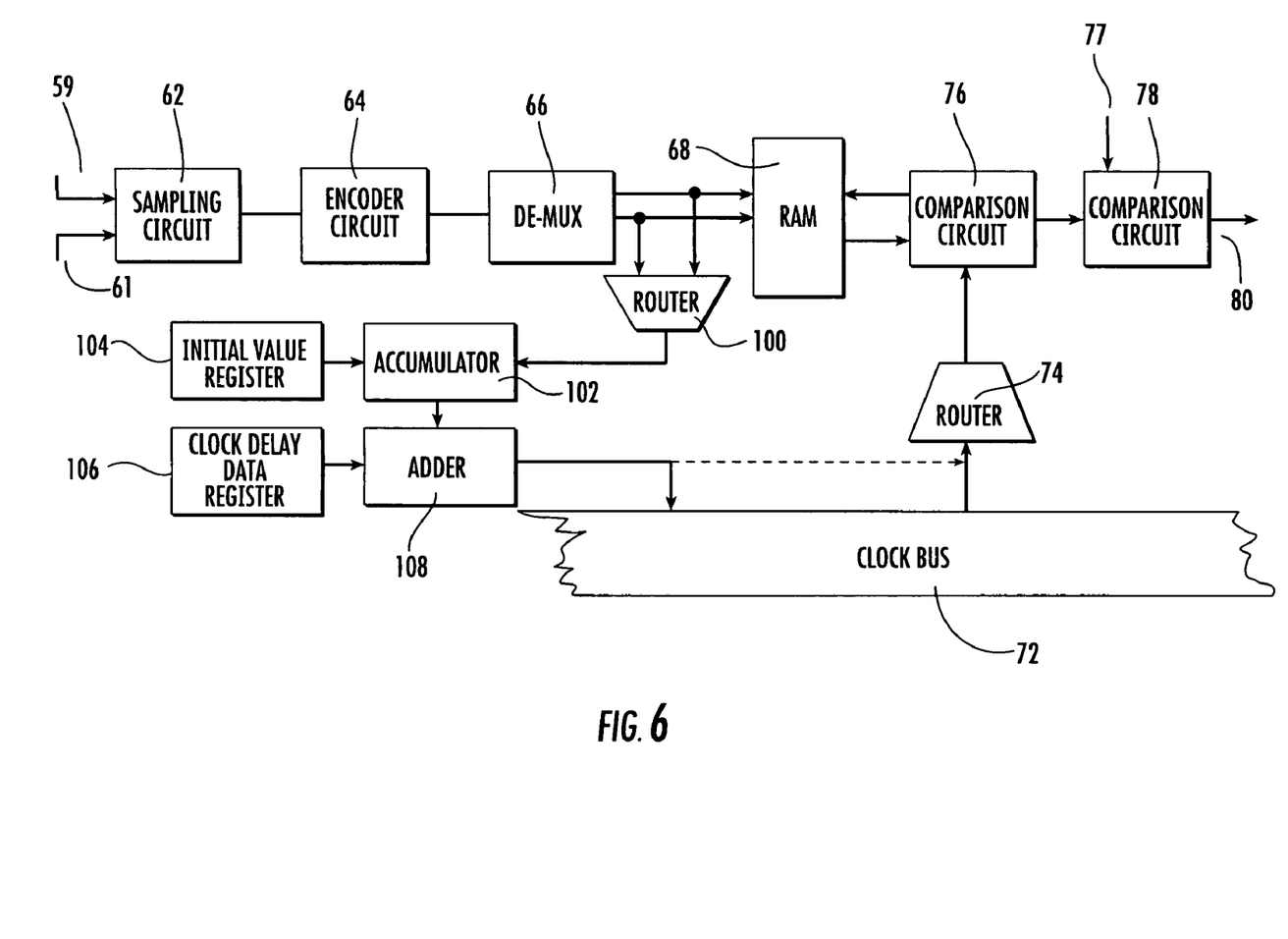
FIG. 6 is a schematic diagram of an apparatus for recovering clock information from a digital signal according to illustrative embodiments of the present invention.

In the illustrative apparatus, a digital signal 59 from a DUT is applied to a sampling circuit 62. A signal from an edge generator 61 is applied as the second input to sampling circuit 62. In the illustrative apparatus, the sampling circuit 62 is the sampling apparatus described in detail with respect to FIG. 3. An encoder circuit 64, a de-multiplexer 66, random access memory 68, comparison circuitry 76, and comparison circuitry 78 which operates on expected values 77 to output pass/fail signals 80 are configured and operate as described hereinbefore with reference to FIG. 4.

Router circuitry 100 can be used to direct encoded edge times from the de-multiplexer 66 to an accumulator 102. The accumulator 102 collects N samples of the encoded edge times and determines the average edge time over N samples. An initial value register 104 in communication with the accumulator 102 stores the accumulator initial value and provides it to the accumulator for calculating average edge times. A clock delay data register 106 can be used to store a de-skew value for combining with the average edge time provided by the accumulator 102 to adjust the average time as needed for providing a correct pointer value. Adder circuitry 108 in communication with the clock delay data register 106 and the accumulator 102 can be used to combine the de-skew value with the average edge time determined by the accumulator 102 to form an adjusted average edge time. The adjusted average edge time can be communicated to a clock bus 72. The adjusted average edge times represent an extracted clock. The clock edge times thereby routed to a tester bus 72 can be used on a plurality of channels. However, when the extracted clock is only used locally, it is not sent over the clock bus 72 but rather is fed directly to routing circuitry 74 which is used to select the signal to be used for pointing to memory 68. This signal becomes the random access memory pointer.

The extracted clock time from adder circuitry 108 can be used as a pointer to address the data stored in memory 68. Routing circuitry 54 should select the local clock coming from the adder circuitry 108 and route this clock edge time to the comparison circuit 76. In addition, the clock from adder circuitry 108 can be routed to the clock bus 72 to be used as a clock for other channels if necessary. The comparison circuit 76 provides the clock edge time as an address to memory 68 and reads the data edge time stored at that address. The data read from memory is compared with the clock edge time to determine the difference therebetween.

Accordingly, the various embodiments of the present invention provide a means for extracting a clock signal from a digital signal of a device under test by adding elements to the multi-strobe apparatus described hereinbefore. The clock extraction means can be used to complement multi-strobe test methods or can stand alone and perform only clock extraction operations.

Although illustrative embodiments of the present invention is described herein generally in terms of strobe pulses, persons having ordinary skill in the art should understand that strobe pulses can include application of a threshold voltage in a cycle of various wave forms such as square wave signals, sine waves signals, triangular waves, impulses and the like to trigger a corresponding latch. For example, it is envisioned that a leading edge of a rectangular wave pulse can be used as a strobe pulse in illustrative embodiments of the invention.

Although illustrative embodiments of the present invention is described herein generally in terms of automatic test equipment, persons having ordinary skill in the art should understand that the present invention can be useful in many other signal comparison operations. For example, it is envisioned that the present invention will find utility for extracting clock information from digital signals in an unlimited number of high speed processing applications.

It will be understood that various modifications may be made to the embodiments disclosed herein. Therefore, the above description should not be construed as limiting, but merely as exemplification of the various embodiments. Those skilled in the art will envision other modifications within the scope and spirit of the claims appended hereto.

What is claimed is:

1. A method for extracting a clock signal from a digital signal, comprising:
   applying a strobe to the digital signal, wherein said strobe comprises a plurality of strobe pulses;
   storing the state of the digital signal at the time of strobe pulses of the strobe;
   encoding the stored states as a digital word thereby identifying an edge time of a state change in the digital signal; and
   determining an average edge time over a predetermined number of samples of the digital word.

2. The method according to claim 1, further comprising:
   storing the digital word in a memory location; and
   using the average edge time as a pointer to the memory location.

3. The method according to claim 1, further comprising adding a de-skew value to the average edge time to form an adjusted average edge time.

4. The method according to claim 3, further comprising:
   storing the digital word in a memory location; and
   using the adjusted average edge time as a pointer to the memory location.

5. The method according to claim 4, further comprising distributing the average edge time to a plurality of channels over a bus wherein the adjusted average edge time is used as a pointer to memory on a recipient channel of the plurality of channels.

6. The method according to claim 4, further comprising:
   comparing a data edge time the memory location addressed by the adjusted average edge time with expected data; and
   providing a pass or fail indication as a result of the comparing.

7. The method according to claim 1, wherein the strobe is applied to the digital signal by:

applying each pulse of the strobe as a latch-clock signal to a corresponding latch of a plurality of latches;

applying the digital signal to the input of each of the latches; and receiving the state of the digital signal as output of each of the latches.

8. The method according to claim 1, wherein the encoding results in a multi-bit word of which a first portion of the multi-bit word identifies the time of the state change and a second portion of the multi-bit word identifies the polarity of the state change.

9. The method according to claim 8, further comprising de-multiplexing transmission of the multi-bit word to reduce a transmission rate thereof.

10. The method according to claim 1, wherein the digital signal comprises a data signal of a device under test.

11. The method according to claim 1, further comprising generating a strobe by:

applying an edge generator output signal to delay circuitry including a series of delay elements; and providing a connection between each of the delay elements to receive a plurality of sequentially delayed copies of edges of the edge generator output signal, each of the delayed copies forming one of the strobe pulses.

12. The method according to claim 1, wherein the delay circuitry is controlled by a delay locked loop and wherein the delay elements comprise controllable summing elements wherein the summing elements are tunable to correct delay line errors.

13. An apparatus for extracting a clock signal from a digital signal, comprising:

a plurality of increasing strobe delay elements in communication with an edge generator;

a plurality of latches, each having a clocking input communicatively connected to a corresponding one of the delay elements and having a data input receiving the data signal;

an encoder in communication with the plurality of latches, the encoder being adapted to transform information stored in the plurality of latches into a digital word representing edge time of the digital signal; and averaging circuitry adapted to receive a plurality of the digital words from the encoder and determine the average thereof.

14. The apparatus according to claim 13, wherein the averaging circuitry comprises:

an accumulator in communication with the encoder to receive the digital words;

a clock delay data register storing a de-skew value; and adding circuitry in communication with the accumulator and the clock delay register, wherein the adding circuitry is adapted for adding the average edge time to the fixed de-skew value to form an extracted clock value.

15. The apparatus according to claim 14, further comprising memory in communication with the encoder, wherein the memory is adapted for receiving and storing the digital words.

16. The apparatus according to claim 15, further comprising dc-multiplexing circuitry in communication with the encoder and the memory wherein the de-multiplexing circuitry is adapted to reduce a rate of data transfer into the memory.

17. The apparatus according to claim 15, wherein the digital signal is a data signal of a device under test.

18. The apparatus according to claim 15, further comprising routing circuitry in communication with the averaging circuitry and the memory and adapted for addressing the memory using the extracted clock value as a pointer to the memory.

19. The apparatus according to claim 15, wherein the routing circuitry comprises a clock bus in communication with the averaging circuitry and the memory, the routing circuitry being adapted for communication with a plurality of channels.

20. The apparatus according to claim 15, further comprising comparison circuitry in communication with the memory and adapted for comparing an expected value corresponding to a specific clock time with a value of the data in the memory addressed by the extracted clock value.

* * * * *

UNITED STATES PATENT AND TRADEMARK OFFICE
CERTIFICATE OF CORRECTION

PATENT NO. : 7,573,957 B2  Page 1 of 1
APPLICATION NO. : 11/234599
DATED : August 11, 2009
INVENTOR(S) : Ronald A. Sartschev and Ernest P. Walker

It is certified that error appears in the above-identified patent and that said Letters Patent is hereby corrected as shown below:

Column 9, line 17 claim 12 should read:
  12.  The method according to claim 11, wherein the delay circuitry is controlled by a delay locked loop and wherein the delay elements comprise controllable summing elements wherein the summing elements are tunable to correct delay line errors.

Column 10, line 23 claim 16 should read:
  16.  The apparatus according to claim 15, further comprising de-multiplexing circuitry in communication with the encoder and the memory wherein the de-multiplexing circuitry is adapted to reduce a rate of data transfer into the memory.

Signed and Sealed this

Twenty-ninth Day of September, 2009

David J. Kappos
*Director of the United States Patent and Trademark Office*